United States Patent
Jeong (10) Patent No.: US 8,125,249 B2
(45) Date of Patent: Feb. 28, 2012

(54) FREQUENCY MEASURING CIRCUIT AND SEMICONDUCTOR DEVICE HAVING THE SAME

(75) Inventor: In-Chul Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/661,668

(22) Filed: Mar. 22, 2010

(65) Prior Publication Data

US 2010/0237918 A1 Sep. 23, 2010

(30) Foreign Application Priority Data

Mar. 20, 2009 (KR) ................. 10-2009-0024020

(51) Int. Cl.
*G01R 23/02* (2006.01)
*G01R 23/12* (2006.01)
(52) U.S. Cl. ...... 327/39; 327/47; 324/76.39; 324/76.52; 324/76.54; 324/76.55
(58) Field of Classification Search .............. 327/39–49; 324/76.39, 76.52, 76.54, 76.55, 76.74
See application file for complete search history.

(56) References Cited

U.S. PATENT DOCUMENTS

| | | | | |
|---|---|---|---|---|
| 3,003,107 A | * | 10/1961 | Charbonnier | 324/175 |
| 5,180,935 A | * | 1/1993 | Abdi et al. | 327/42 |
| 6,111,812 A | | 8/2000 | Gans et al. | |
| 6,304,511 B1 | | 10/2001 | Gans et al. | |
| 6,597,204 B2 | * | 7/2003 | Imamura | 327/20 |

FOREIGN PATENT DOCUMENTS

| | | |
|---|---|---|
| JP | 8-292216 A | 11/1996 |
| JP | 2007-121063 A | 5/2007 |
| KR | 10-0680330 B1 | 2/2007 |

* cited by examiner

*Primary Examiner* — Patrick O'Neill
(74) *Attorney, Agent, or Firm* — Onello & Mello LLP (57) ABSTRACT

A frequency measuring circuit and a semiconductor device having the frequency measuring circuit include a divided and shifted clock signal generator, a delayed clock signal generator and a phase detecting unit. The divided and shifted clock signal generator divides a frequency of a clock signal input from an exterior to output a frequency-divided clock signal, and delays the frequency-divided clock signal by a time proportional to a period of the clock signal to output a shifted clock signal. The delayed clock signal generator delays the frequency-divided clock signal by a fixed time to generate a plurality of delayed clock signals. The phase detecting unit receives the plurality of delayed clock signals and the shifted clock signal and detects a phase difference between each of the plurality of delayed clock signals and the shifted clock signal to output a plurality of phase detecting signals that represent information related to a frequency of the clock signal.

10 Claims, 11 Drawing Sheets

FREQUENCY MEASURING CIRCUIT AND SEMICONDUCTOR DEVICE HAVING THE SAME

PRIORITY STATEMENT

This application claims the benefit of priority under 35 U.S.C. §119 from Korean Patent Application No. 10-2009-0024020, filed in the Korean Intellectual Property Office on Mar. 20, 2009, the contents of which are hereby incorporated herein by reference in their entirety.

BACKGROUND

1. Field

Exemplary embodiments relate to a frequency measuring circuit, and particularly to a frequency measuring circuit that measures frequency of an input clock signal and outputs information for the frequency of the clock signal, and a semiconductor device having the same.

2. Description of Related Art

Internal circuits of a semiconductor device operate differently from each other. Accordingly, clock signals input to a semiconductor device may have various frequencies. For example, when the frequency of the clock signal input to the semiconductor device is high, the semiconductor device may be designed to supply a large current to an input/output driver to raise driving capability. Further, when the frequency of the clock signal input to the semiconductor device is low, the semiconductor device may be designed to supply a relatively small current to the input/output driver. Further, in the case of a semiconductor memory device, the circuit may be designed to have a large latency when the frequency of the clock signal input to the semiconductor device is high, and have a small latency when the frequency of the clock signal input to the semiconductor device is low. Further, a delay-locked-loop (DLL) may be used to generate the internal clock signal that is synchronized with a clock signal supplied from the exterior. The delay circuit having a short delay time may be used to synchronize the internal clock signal with the external clock signal when the frequency of the clock signal input from the exterior is high, but the delay circuit having a long delay time is required when the frequency of the clock signal input from the exterior is low.

Therefore, information related to the frequency of the clock signal input from the exterior is required to optimize operation of the semiconductor device.

SUMMARY

Exemplary embodiments provide a frequency measuring circuit having small power consumption and having high precision, and capable of measuring the frequency of the clock signal input from the exterior quickly.

Exemplary embodiments also provide a semiconductor device including the frequency measuring circuit.

According to a first aspect, the inventive concept is directed to a frequency measuring circuit including a divided and shifted clock signal generator, a delayed clock signal generator and a phase detecting unit. The divided and shifted clock signal generator divides a frequency of a clock signal input from an exterior to output a frequency-divided clock signal, and delays the frequency-divided clock signal by a time proportional to a period of the clock signal to output a shifted clock signal. The delayed clock signal generator delays the frequency-divided clock signal by a fixed time to generate a plurality of delayed clock signals. The phase detecting unit receives the plurality of delayed clock signals and the shifted clock signal, and detects a phase difference between each of the plurality of delayed clock signals and the shifted clock signal to output a plurality of phase detecting signals that represent information related to a frequency of the clock signal.

In exemplary embodiments, the divided and shifted clock signal generator may include a frequency dividing unit and a shifted clock signal generator. The frequency dividing unit divides the frequency of the clock signal to output the frequency-divided clock signal. The shifted clock signal generator receives the frequency-divided clock signal and delays the frequency-divided clock signal by the time proportional to the period of the clock signal to output the shifted clock signal in response to the clock signal.

In exemplary embodiments, the delayed clock signal generator may include a first delay circuit and a second delay circuit. The first delay circuit has one or more delay device serially connected and delays the frequency-divided clock signal by a first time to output a first delayed clock signal of the plurality of delayed clock signals. The second delay circuit has one or more delay devices serially connected, delays the first delayed clock signal, and outputs delayed clock signals except the first delayed clock signal.

In exemplary embodiments, the frequency dividing unit of the frequency measuring circuit may include one or more frequency dividers. Each of the frequency dividers may include a first frequency-dividing transmission gate, a first frequency-dividing latch circuit, a second frequency-dividing transmission gate and a second frequency-dividing latch circuit. The first frequency-dividing transmission gate transmits an inverted signal of an output signal in response to a first level of an input signal. The first frequency-dividing latch circuit latches and inverts a signal transmitted through the first frequency-dividing transmission gate. The second frequency-dividing transmission gate transmits an output signal of the first frequency-dividing latch circuit in response to a second level of the input signal. The second frequency-dividing latch circuit latches and inverts a signal transmitted through the second frequency-dividing transmission gate to output the output signal. The shifted clock signal generator may include at least one first shift latch unit and at least one second shift latch unit. The at least one first shift latch unit latches, inverts and outputs an input signal in response to a first level of the clock signal. The at least one second shift latch unit latches, inverts and outputs the input signal in response to a second level of the clock signal. The first shift latch unit and the second shift latch unit are arranged one after the other and connected serially.

In exemplary embodiments, the phase detecting unit may include a plurality of phase detectors receiving a corresponding delayed clock signal of the plurality of delayed clock signals and the shifted clock signal, detecting a phase difference between the corresponding delayed clock signal and the shifted clock signal, and outputting a corresponding phase detecting signal of the plurality of phase detecting signals. Each of the phase detectors may include a first NAND gate and a second NAND gate. The first NAND gate receives the shifted clock signal and the corresponding phase detecting signal, and performs a logical NAND operation. The second NAND gate receives the corresponding delayed clock signal and an output signal of the first NAND gate, and performs a logical NAND operation to output the corresponding phase detecting signal.

According to another aspect, the inventive concept is directed to a semiconductor device including a frequency measuring circuit and a control signal generator. The frequency measuring circuit receives a clock signal input from an exterior to output a plurality of phase detecting signals that represent information related to a frequency of the clock signal. The control signal generator outputs a control signal in response to the plurality of phase detecting signals. The frequency measuring circuit includes a divided and shifted clock signal generator, a delayed clock signal generator and a phase detecting unit. The divided and shifted clock signal generator divides a frequency of the clock signal input from the exterior to output a frequency-divided clock signal, and delays the frequency-divided clock signal by a time proportional to a period of the clock signal to output a shifted clock signal. The delayed clock signal generator delays the frequency-divided clock signal by a fixed time to generate a plurality of delayed clock signals. The phase detecting unit receives the plurality of delayed clock signals and the shifted clock signal, and detects a phase difference between each of the plurality of delayed clock signals and the shifted clock signal to output the plurality of phase detecting signals that represent information related to a frequency of the clock signal.

In exemplary embodiments, the divided and shifted clock signal generator of the frequency measuring circuit of the semiconductor device may include a frequency dividing unit and a shifted clock signal generator. The frequency dividing unit divides the frequency of the clock signal to output the frequency-divided clock signal. The shifted clock signal generator receives the frequency-divided clock signal and delays the frequency-divided clock signal by the time proportional to the period of the clock signal to output the shifted clock signal in response to the clock signal.

In exemplary embodiments, the delayed clock signal generator of the frequency measuring circuit of the semiconductor device may include a first delay circuit and a second delay circuit. The first delay circuit has one or more delay devices serially connected and delays the frequency-divided clock signal by a first time to output a first delayed clock signal of the plurality of delayed clock signals. The second delay circuit has one or more delay device serially connected, delays the first delayed clock signal, and outputs delayed clock signals except the first delayed clock signal.

In exemplary embodiments, the frequency dividing unit of the frequency measuring circuit of the semiconductor device may include one or more frequency dividers. Each of the frequency dividers may include a first frequency-dividing transmission gate, a first frequency-dividing latch circuit, a second frequency-dividing transmission gate and a second frequency-dividing latch circuit. The first frequency-dividing transmission gate transmits an inverted signal of an output signal in response to a first level of an input signal. The first frequency-dividing latch circuit latches and inverts a signal transmitted through the first frequency-dividing transmission gate. The second frequency-dividing transmission gate transmits an output signal of the first frequency-dividing latch circuit in response to a second level of the input signal. The second frequency-dividing latch circuit latches and inverts a signal transmitted through the second frequency-dividing transmission gate to output the output signal. The shifted clock signal generator may include at least one first shift latch unit and at least one second shift latch unit. The at least one first shift latch unit latches, inverts and outputs the input signal in response to a first level of the clock signal. The at least one second shift latch unit latches, inverts and outputs the input signal in response to a second level of the clock signal. The first shift latch unit and the second shift latch unit are arranged one after the other and connected serially.

In exemplary embodiments, the phase detecting unit of the frequency measuring circuit of the semiconductor device may include a plurality of phase detectors receiving a corresponding delayed clock signal of the plurality of delayed clock signals and the shifted clock signal, detecting a phase difference between the corresponding delayed clock signal and the shifted clock signal, and outputting a corresponding phase detecting signal of the plurality of phase detecting signals. Each of the phase detectors may include a first NAND gate and a second NAND gate. The first NAND gate receives the shifted clock signal and the corresponding phase detecting signal, and performs a logical NAND operation. The second NAND gate receives the corresponding delayed clock signal and an output signal of the first NAND gate, and performs a logical NAND operation to output the corresponding phase detecting signal.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

FIG. 9 and FIG. 10 are timing diagrams illustrating the operation of the frequency measuring circuit according to exemplary embodiments.

DETAILED DESCRIPTION OF THE EMBODIMENTS

Various exemplary embodiments will now be described more fully with reference to the accompanying drawings in which some exemplary embodiments are shown. In the drawings, the thicknesses of layers and regions may be exaggerated for clarity. Detailed illustrative embodiments are described herein. However, specific structural and functional details described herein are merely representative for purposes of describing exemplary embodiments. This inventive concept, however, may be embodied in many alternate forms and should not be construed as limited to only exemplary embodiments set forth herein.

In order to more specifically describe exemplary embodiments, various aspects will be described in detail with reference to the attached drawings. However, the inventive concept is not limited to exemplary embodiments described.

Figure 1:
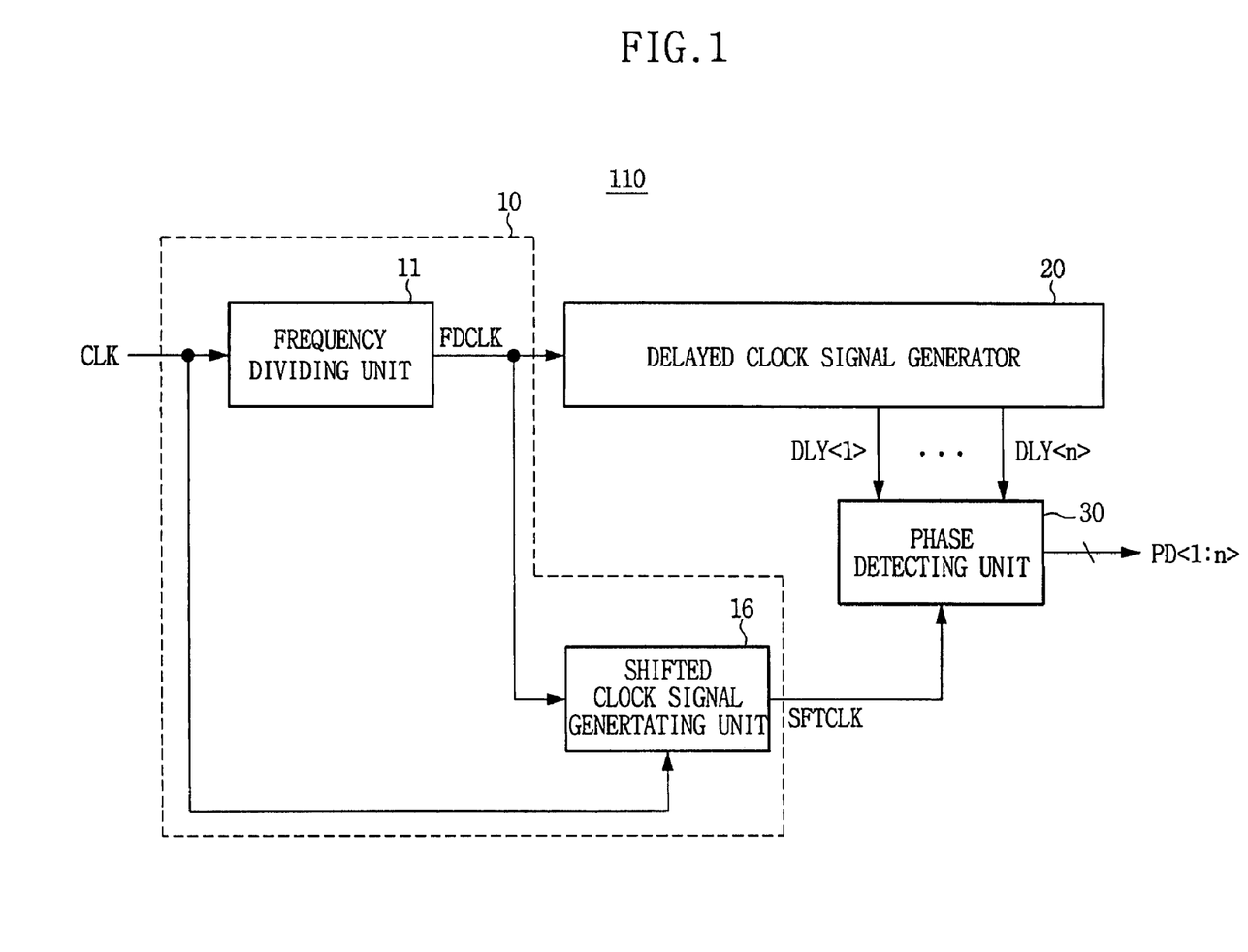
FIG. 1 is a block diagram illustrating a frequency measuring circuit according to exemplary embodiments.

FIG. 1 is a block diagram illustrating a frequency measuring circuit according to exemplary embodiments. The frequency measuring circuit 110 includes a divided and shifted clock signal generator 10, a delayed clock signal generator 20 and a phase detecting unit 30. The divided and shifted clock signal generator 10 includes a frequency dividing unit 11 and a shifted clock signal generator 16.

Hereinafter, the function of each of the blocks shown in FIG. 1 will be described.

The divided and shifted clock signal generator 10 divides a frequency of a clock signal CLK input from an exterior to output a frequency-divided clock signal FDCLK, and delays the frequency-divided clock signal FDCLK by a time proportional to a period of the clock signal CLK to output a shifted clock signal SFTCLK.

The frequency dividing unit 11 divides a frequency of the clock signal CLK to output the frequency-divided clock signal FDCLK.

The shifted clock signal generator 16 receives the frequency-divided clock signal FDCLK and the clock signal CLK, and delays the frequency-divided clock signal FDCLK by the time corresponding to the frequency of the clock signal CLK to output the shifted clock signal SFTCLK. The shifted clock signal generator 16 may be constructed to delay the frequency-divided clock signal FDCLK by the time which is a few multiples of the frequency of the clock signal CLK and output the delayed signal. That is, the shifted clock signal generator 16 receives the frequency-divided clock signal FDCLK and outputs the shifted clock signal SFTCLK having a delayed time difference proportional to the period of the clock signal with the frequency-divided clock signal FDCLK in response to the clock signal CLK.

The delayed clock signal generator 20 receives the frequency-divided clock signal FDCLK and delays the frequency-divided clock signal FDCLK by a constant time regardless of the frequency of the clock signal CLK to generate a plurality of delayed clock signals DLY<1:n>. That is, the delayed clock signal generator 20 receives the frequency-divided clock signal FDCLK and outputs the plurality of delayed clock signals DLY<1:n> irrespective of the frequency of the frequency-divided clock signal FDCLK and the frequency of the clock signal CLK.

The phase detecting unit 30 receives the plurality of delayed clock signals DLY<1:n> and the shifted clock signal SFTCLK, and compares the phase of each of the plurality of delayed clock signals DLY<1:n> and the phase of the shifted clock signal SFTCLK to output phase detecting signals PD<1:n>.

Figure 2:
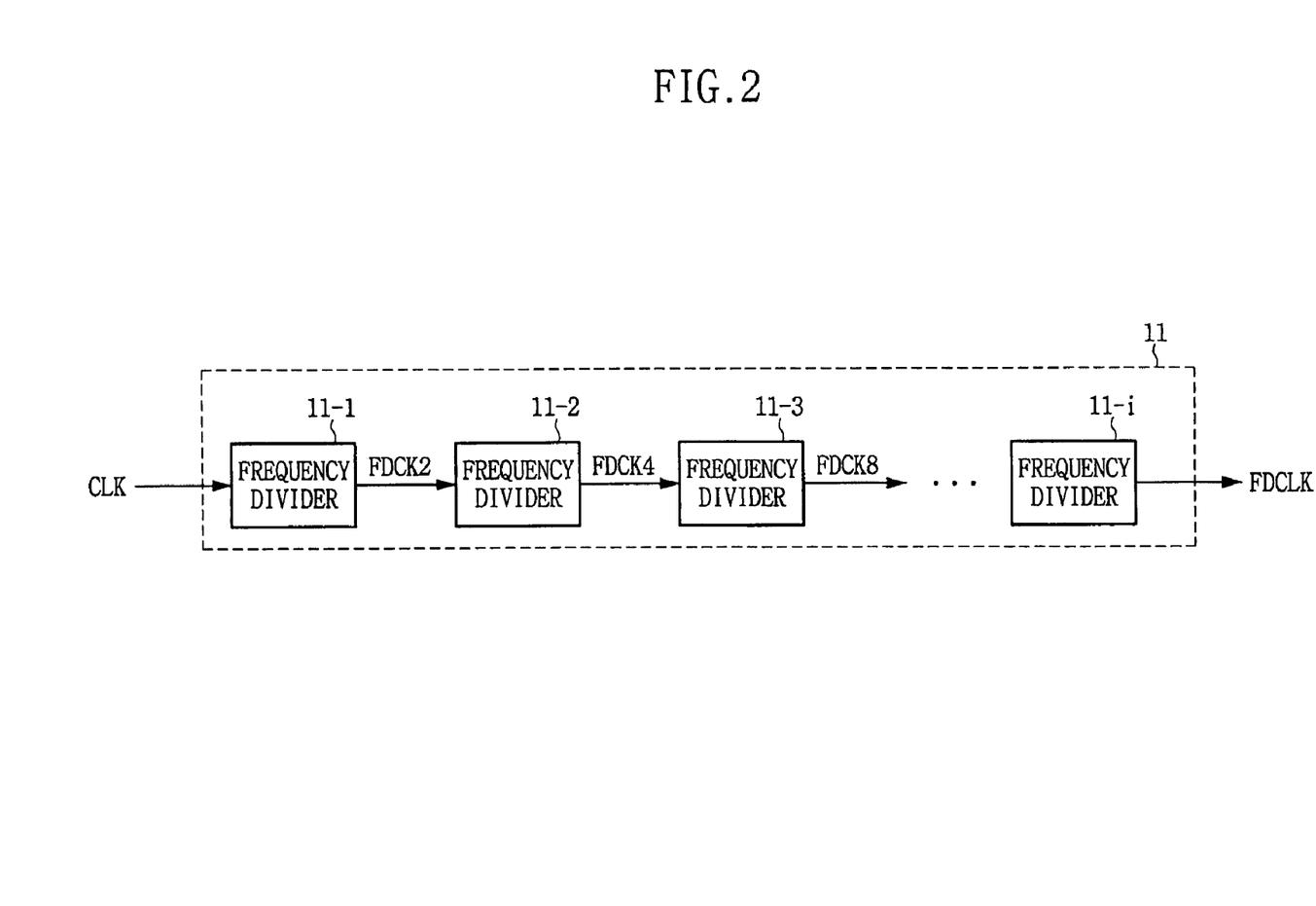
FIG. 2 is a block diagram illustrating a frequency dividing unit of the frequency measuring circuit shown in FIG. 1.

FIG. 2 is a block diagram illustrating a frequency dividing unit 11 of the divided and shifted clock signal generator 10 of the frequency measuring circuit shown in FIG. 1. The frequency dividing unit 11 may be comprised of a plurality of frequency dividers 11-1 to 11-i.

Hereinafter, the function of each of the blocks shown in FIG. 2 will be described.

Each of the plurality of frequency dividers 11-1 to 11-i divides the frequency of input signals to generate output signals having the frequency which is half the input signal. Therefore, the frequency of the frequency-divided clock signal FDCLK that the frequency dividing unit 11 outputs is $\frac{1}{2^i}$ times the frequency of the clock signal CLK.

Figure 3:
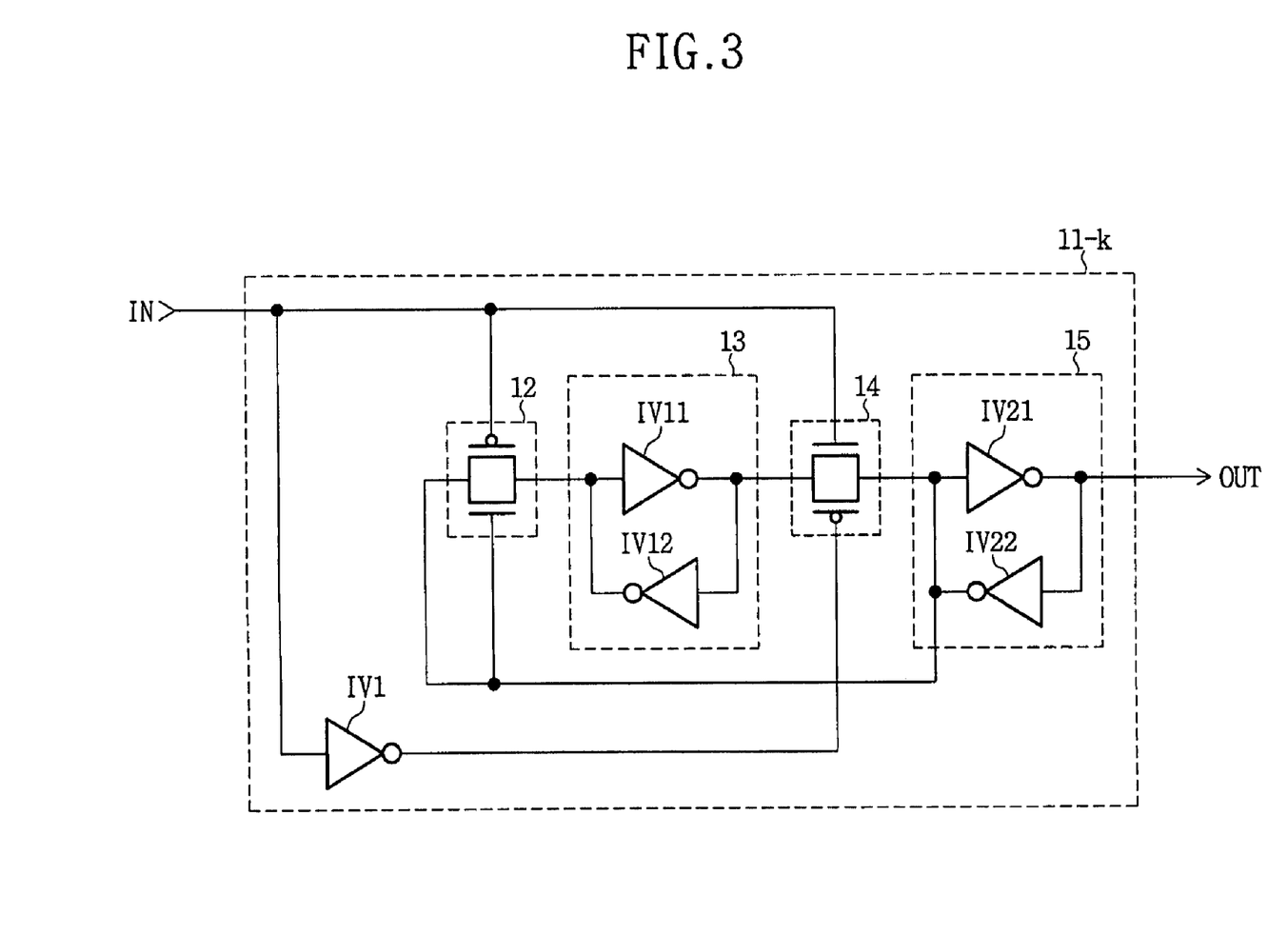
FIG. 3 is a circuit diagram illustrating a frequency divider of a frequency dividing unit shown in the frequency measuring circuit shown in FIG. 2.

FIG. 3 is a circuit diagram illustrating an example of each of the frequency dividers 11-1 to 11-i, which may be comprised of a first frequency-dividing transmission gate 12, a first frequency-dividing latch circuit 13, a second frequency-dividing transmission gate 14, a second frequency-dividing latch circuit 15 and an inverter IV1. Further, the first frequency-dividing latch circuit 13 may include two inverters INV11 and INV12, and the second frequency-dividing latch circuit 15 may include two inverters INV21 and INV22.

Hereinafter, each of the blocks shown in FIG. 3 will be described.

The first frequency-dividing transmission gate 12 transmits a signal of an input terminal of the second frequency-dividing latch circuit 15 to an input terminal of the first frequency-dividing latch circuit 13 in response to a first level (i.e., low level) of an input signal IN. The second frequency-dividing transmission gate 14 transmits a signal of an output terminal of the second frequency-dividing latch circuit 13 to an input terminal of the second frequency-dividing latch circuit 15 in response to a second level (i.e., high level) of the input signal IN.

The first frequency-dividing latch circuit 13 latches and inverts a signal transmitted through the first frequency-dividing transmission gate 12, and outputs the signal. The second frequency-dividing latch circuit 15 latches and inverts a signal transmitted through the second frequency-dividing transmission gate to output the output signal OUT.

Each of the frequency dividers 11-1 to 11-i may have the same structure as shown in FIG. 3. The input signal IN may be one of the clock signal CLK, a first frequency-divided clock signal FDCK2, a second frequency-divided clock signal FDCK4, and a third frequency-divided clock signal FDCK8, and the output signal OUT may be one of the first frequency-divided clock signal FDCK2, the second frequency-divided clock signal FDCK4, the third frequency-divided clock signal FDCK8 and the frequency-divided clock signal FDCLK.

Figure 4:
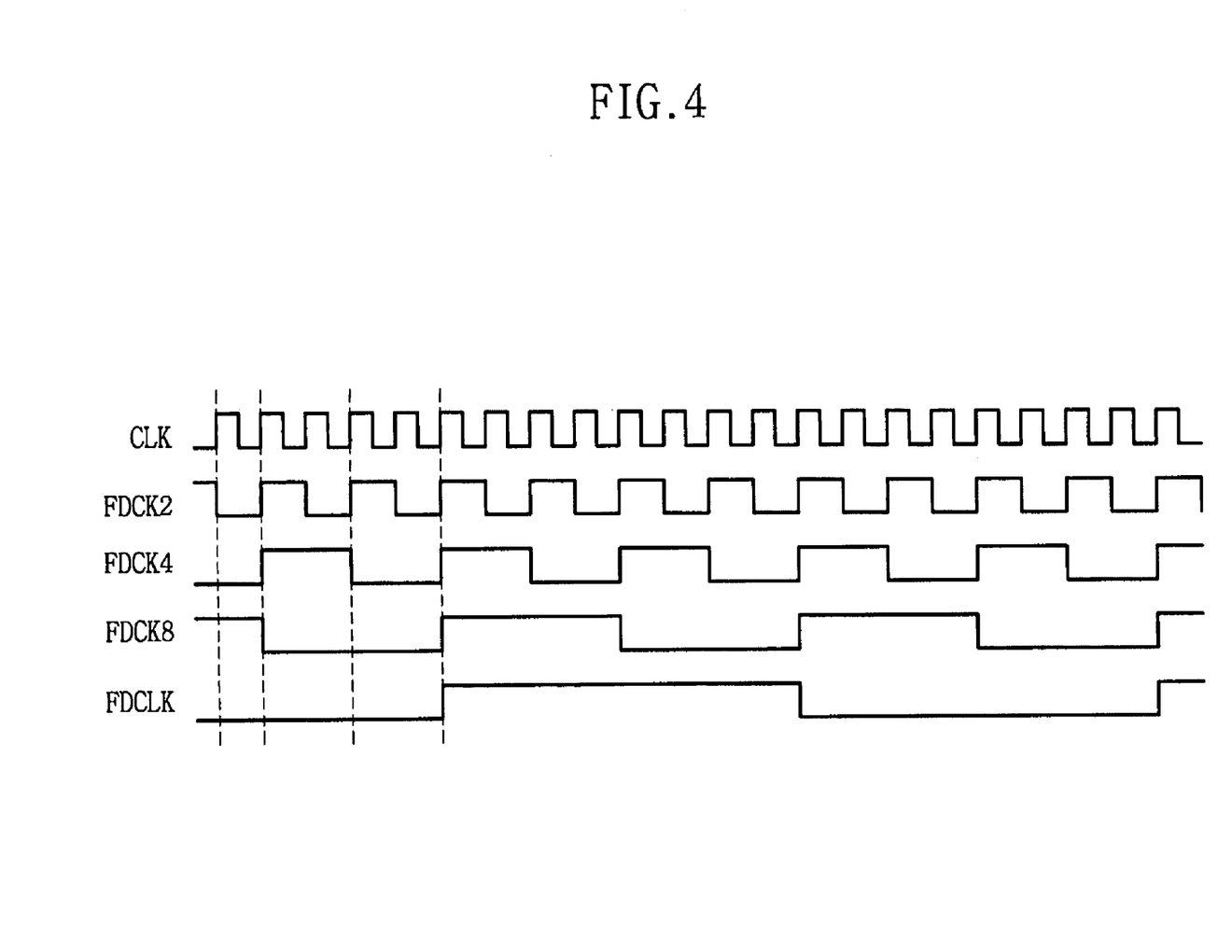
FIG. 4 is a timing diagram illustrating the operation of a frequency dividing unit of a frequency measuring circuit shown in FIG. 2 and FIG. 3.

FIG. 4 is a timing diagram illustrating the operation of the frequency dividing unit 11 of a frequency measuring circuit shown in FIG. 2 and FIG. 3. In FIG. 4, the timing diagram for the frequency dividing unit 11 having four dividers is shown as an example. In FIG. 4, CLK denotes the clock signal, FDCK2 denotes the first frequency-divided clock signal output from the frequency divider 11-1, FDCK4 denotes the second frequency-divided clock signal output from the frequency divider 11-2, FDCK8 denotes the third frequency-divided clock signal output from the frequency divider 11-3, and FDCLK denotes the frequency-divided clock signal output from the frequency divider 11-4, that is, output from the frequency dividing unit 11.

Hereinafter, the frequency dividing unit 11 of the frequency measuring circuit according to an exemplary embodiment will be described referring to FIG. 4.

The initial value of the output terminal of each of the first frequency-dividing latch circuit 13 and the second frequency-dividing latch circuit 15 is assumed to have a logic high level.

First, the frequency divider 11-1 will be described.

When the clock signal CLK has a logic low level, the first frequency-dividing transmission gate 12 of the frequency divider 11-1 is turned on and the second frequency-dividing transmission gate 14 of the frequency divider 11-1 is turned off. Therefore, the signal of the output terminal of the second frequency-dividing latch circuit 15, that is, the first frequency-divided clock signal FDCK2, is fixed to a logic high level, the signal of the output terminal of the first frequency-dividing latch circuit 13 of the frequency divider 11-1 becomes a logic high level in response to the signal of the input terminal of the second frequency-dividing latch circuit 15.

When the clock signal CLK becomes a logic high level, the first frequency-dividing transmission gate 12 of the frequency divider 11-1 is turned off and the second frequency-dividing transmission gate 14 of the frequency divider 11-1 is turned on. Therefore, the signal of the output terminal of the first frequency-dividing latch circuit 13 of the frequency divider 11-1 is fixed to logic high level, and the signal of the output terminal of the second frequency-dividing latch circuit 15 of the frequency divider 11-1, that is, the first frequency-divided clock signal FDCK2, becomes a logic low level.

When the clock signal CLK becomes a logic low level again, the first frequency-divided clock signal FDCK2 of the frequency divider 11-1 is fixed to a logic low level, and the signal of the output terminal of the first frequency-dividing latch circuit 13 of the frequency divider 11-1 becomes a logic low level.

When the clock signal CLK becomes a logic high level again, the signal of the output terminal of the first frequency-dividing latch circuit 13 of the frequency divider 11-1 is fixed to a logic low level, and the first frequency-divided clock signal FDCK2 of the frequency divider 11-1 becomes a logic high level.

As the operation described above is performed repeatedly, the frequency divider 11-1 may output the first frequency-divided clock signal FDCK2 having a frequency half the frequency of the clock signal CLK as illustrated in FIG. 4.

Next, the frequency divider 11-2 will be described.

The first frequency-divided clock signal FDCK2 is input to the frequency divider 11-2.

When the first frequency-divided clock-signal FDCK2 has a logic high level, the first frequency-dividing transmission gate 12 of the frequency divider 11-2 is turned off and the second frequency-dividing transmission gate 14 of the frequency divider 11-2 is turned on. Therefore, the signal of the output terminal of the first frequency-dividing latch circuit 13 of the frequency divider 11-1 is fixed to a logic high level, and the signal of the output terminal of the second frequency-dividing latch circuit 15 of the frequency divider 11-2, that is, the second frequency-divided clock signal FDCK4, becomes a logic low level.

When the first frequency-divided clock-signal FDCK2 becomes a logic low level, the first frequency-dividing transmission gate 12 of the frequency divider 11-2 is turned on and the second frequency-dividing transmission gate 14 of the frequency divider 11-2 is turned off. Therefore, the signal of the output terminal of the second frequency-dividing latch circuit 15 of the frequency divider 11-2, that is, the first frequency-divided clock signal FDCK4, is fixed to a logic low level, and the signal of the output terminal of the first frequency-dividing latch circuit 13 of the frequency divider 11-2 becomes a logic low level.

When the first frequency-divided clock-signal FDCK2 becomes a logic high level again, the signal of the output terminal of the second frequency-dividing latch circuit 15 of the frequency divider 11-2, that is, the second frequency-divided clock signal FDCK4, becomes a logic high level. When the first frequency-divided clock-signal FDCK2 becomes a logic low level again, the signal of the output terminal of the second frequency-dividing latch circuit 15 of the frequency divider 11-2, that is, the second frequency-divided clock signal FDCK4, maintains a logic high level.

As the operation described above is performed repeatedly, the frequency divider 11-2 may output the second frequency-divided clock signal FDCK4 having a frequency one-fourth times the frequency of the clock signal CLK.

The frequency divider 11-3 may be readily understood with reference to the frequency divider 11-1 described above, and the frequency divider 11-4 may be readily understood with reference to the frequency divider 11-2 described above.

For example, when the frequency dividing unit 11 includes four frequency dividers, the frequency-divided clock signal FDCLK has a frequency one-sixteenth times the frequency of the clock signal CLK. As described above, the frequency dividing unit 11 may include various numbers of frequency dividers, and the frequency of the frequency-divided clock signal FDCLK is determined by the number of frequency dividers that the frequency dividing unit 11 has. Further, above, the operation of the frequency dividing unit 11 was described for the case in which the initial value of the output terminal of the frequency-dividing latch circuits 13 and 15 was assumed to have a logic high level. However, the initial value of the frequency-dividing latch circuits 13 and 15 may have a logic low level. In this case, only the phase of the frequency-divided clock signal FDCLK may be changed.

Figure 5:
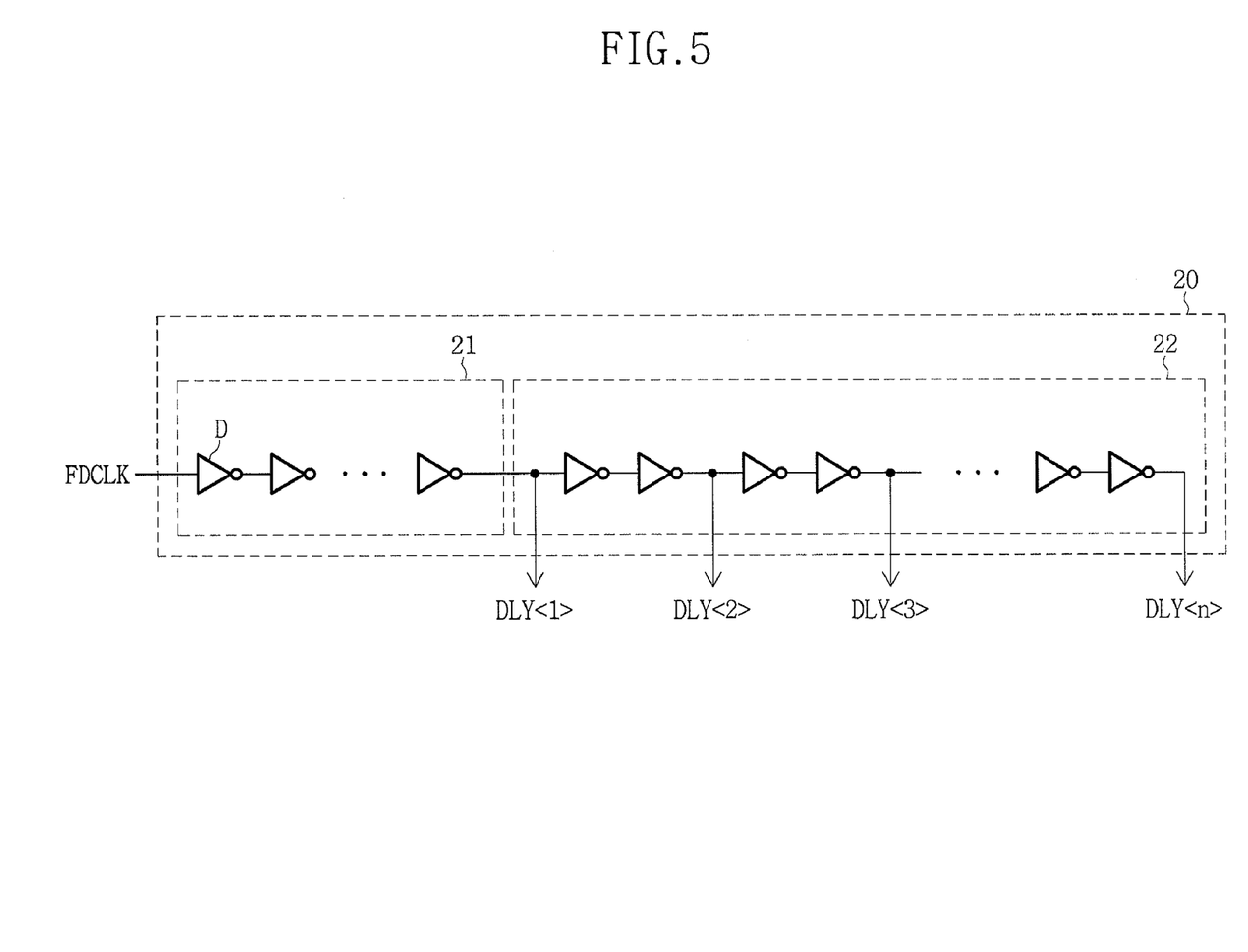
FIG. 5 is a circuit diagram illustrating a delayed clock signal generator of the frequency measuring circuit shown in FIG. 1.

FIG. 5 is a circuit diagram illustrating a delayed clock signal generator 20 of the frequency measuring circuit shown in FIG. 1. The delayed clock signal generator 20 may include a first delay circuit 21 and a second delay circuit 22, and each of the first delay circuit 21 and the second delay circuit 22 may include a plurality of delay devices D (e.g. inverters) connected in series.

Hereinafter, each of the blocks shown in FIG. 5 will be described.

The first delay circuit 21 receives the frequency-divided clock signal FDCLK and delays the frequency-divided clock signal FDCLK without reference to the frequency of the clock signal CLK to output a delayed clock signal DLY<1> of a plurality of delayed clock signals DLY<1:n>.

The second delay circuit 22 receives the delayed clock signal DLY<1> and outputs delayed clock signals DLY<2:n> having different delay times from each other.

That is, the delayed clock signal generator 20 receives the frequency-divided clock signal FDCLK and outputs the delayed clock signals DLY<1:n> having different delay times from each other. The difference in delay time between the frequency-divided clock signal FDCLK and each of the delayed clock signals DLY<1:n> is determined by the number and the property of delay devices comprising the delayed clock signal generator 20 without reference to the period of the of the clock signal CLK.

Figure 6:
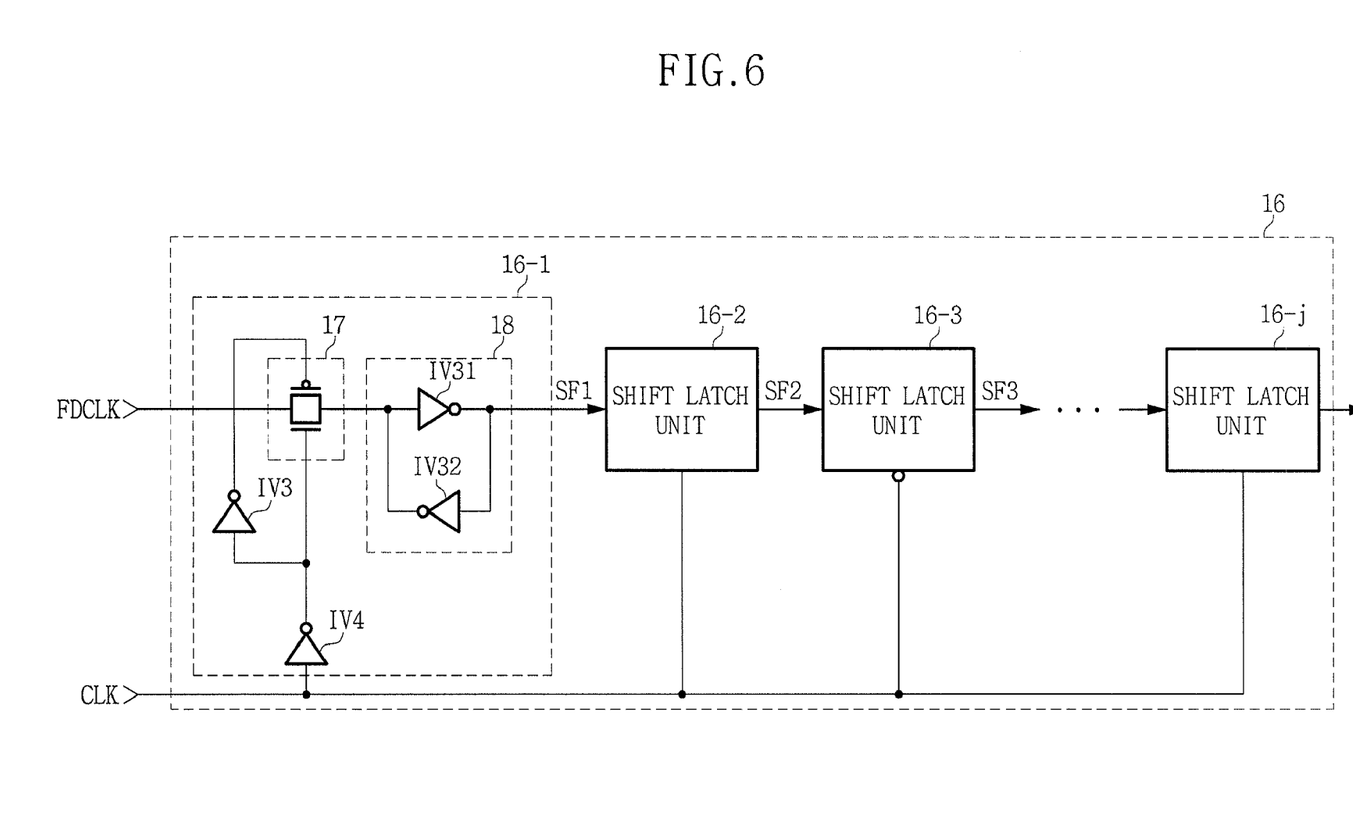
FIG. 6 is a circuit diagram illustrating a shifted clock signal generator of the frequency measuring circuit shown in FIG. 1.

FIG. 6 is a circuit diagram illustrating a shifted clock signal generator 16 of the frequency measuring circuit shown in FIG. 1. The shifted clock signal generator 16 may include a plurality of shift latch units 16-1 to 16-j, and each of the plurality of shift latch units 16-1 to 16-j may include a delay transmission gate 17 and a delay latch 18.

Hereinafter, each of the blocks shown in FIG. 6 will be described.

Each of the shift latch units 16-1, 16-3, . . . latches an input signal in response to a first level (e.g. a logic low level) of the clock signal CLK, and each of the shift latch units 16-2, 16-4, . . . latches an input signal in response to a second level (e.g. a logic high level) of the clock signal CLK. Further, the shift latch units 16-1, 16-3, . . . and the shift latch units 16-2, 16-4, . . . are arranged one after the other and connected serially.

That is, the delay transmission gate 17 of each of the shift latch units 16-1, 16-3, . . . transmits the input signal to the delay latch 18 of each of the shift latch units 16-1, 16-3, . . . in response to the first level (e.g. a logic low level) of the clock signal CLK. The delay transmission gate 17 of each of the shift latch units 16-2, 16-4, . . . transmits the input signal to the delay latch 18 of each of the shift latch units 16-2, 16-4, . . . in response to the second level (e.g. a logic high level) of the clock signal CLK. Further, the delay latch 18 of each of the shift latch units 16-1 to 16-j latches and inverts the input signal, and outputs the inverted signal.

Figure 7:
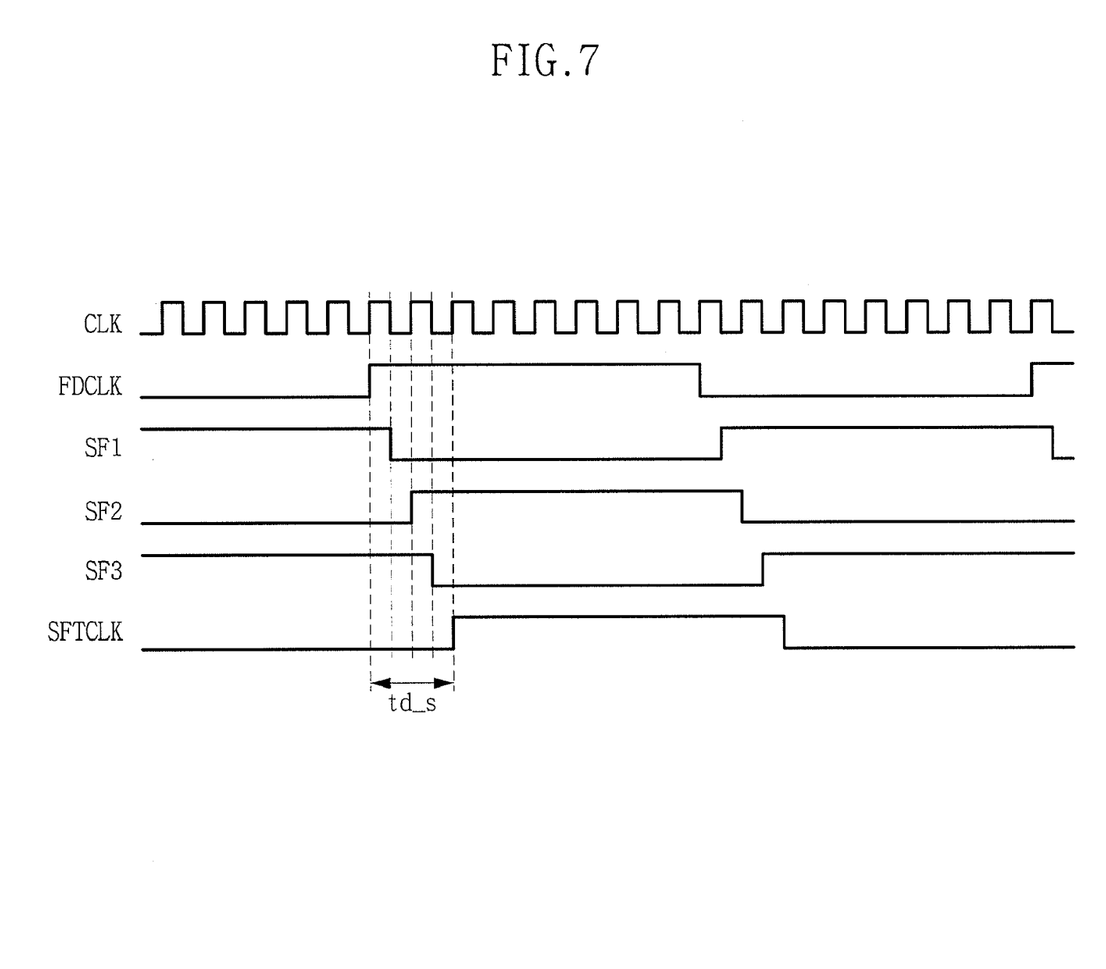
FIG. 7 is a timing diagram illustrating the operation of the shifted clock signal generator of the frequency measuring circuit of FIG. 6.

FIG. 7 is a timing diagram illustrating the operation of the shifted clock signal generator 16 of the frequency measuring circuit of FIG. 6. In FIG. 7, the timing diagram for the shifted clock signal generator 16 having four shift latch units is shown as an example. In FIG. 7, CLK denotes the clock signal, FDCLK denotes the frequency-divided clock signal, SF1, SF2 and SF3 denote output signals output from the shift latch units 16-1, 16-2 and 16-3, and SFTCLK denotes a signal output from the shift latch unit 16-4, that is, a shifted clock signal output from the shifted clock signal generator 16.

Hereinafter, the shifted clock signal generator 16 shown in FIG. 6 will be described referring to FIG. 7.

The shift latch unit 16-1 latches and inverts the frequency-divided clock signal FDCLK in response to the logic low level of the clock signal CLK and outputs the inverted signal. That is, the shift latch unit 16-1 delays the frequency-divided clock signal FDCLK by a half period of the clock signal CLK, inverts the delayed signal, and outputs the inverted signal SF1.

The shift latch unit 16-2 latches and inverts the output signal SF1 of the shift latch unit 16-1 in response to the logic high level of the clock signal CLK and outputs the inverted signal. That is, the shift latch unit 16-2 delays the output signal SF1 of the shift latch unit 16-1 by a half period of the clock signal CLK, inverts the delayed signal, and outputs the inverted signal SF2.

The operation of the shift latch units 16-3 and 16-4 may be readily understood referring to the operation of the shift latch units 16-1 and 16-2 described above, respectively.

Accordingly, when the shifted clock signal generator 16 includes four shift latch units, the shifted clock signal generator 16 delays the frequency-divided clock signal FDCLK by twice the period of the clock signal CLK and generates the shifted clock signal SFTCLK. That is, the delay time difference td_s between the shifted clock signal SFTCLK and the frequency-divided clock signal FDCLK is determined by the frequency of the clock signal, and is proportional to the period of the clock signal CLK.

In FIG. 7, the shifted clock signal generator 16 including four shift latch units 16-1 to 16-4 is illustrated as an example. The number of shift latch units that the shifted clock signal generator 16 includes is determined by the multiple of the frequency of the clock signal CLK by which the frequency-divided clock signal FDCLK is delayed to generate the shifted clock signal SFTCLK.

Figure 8:
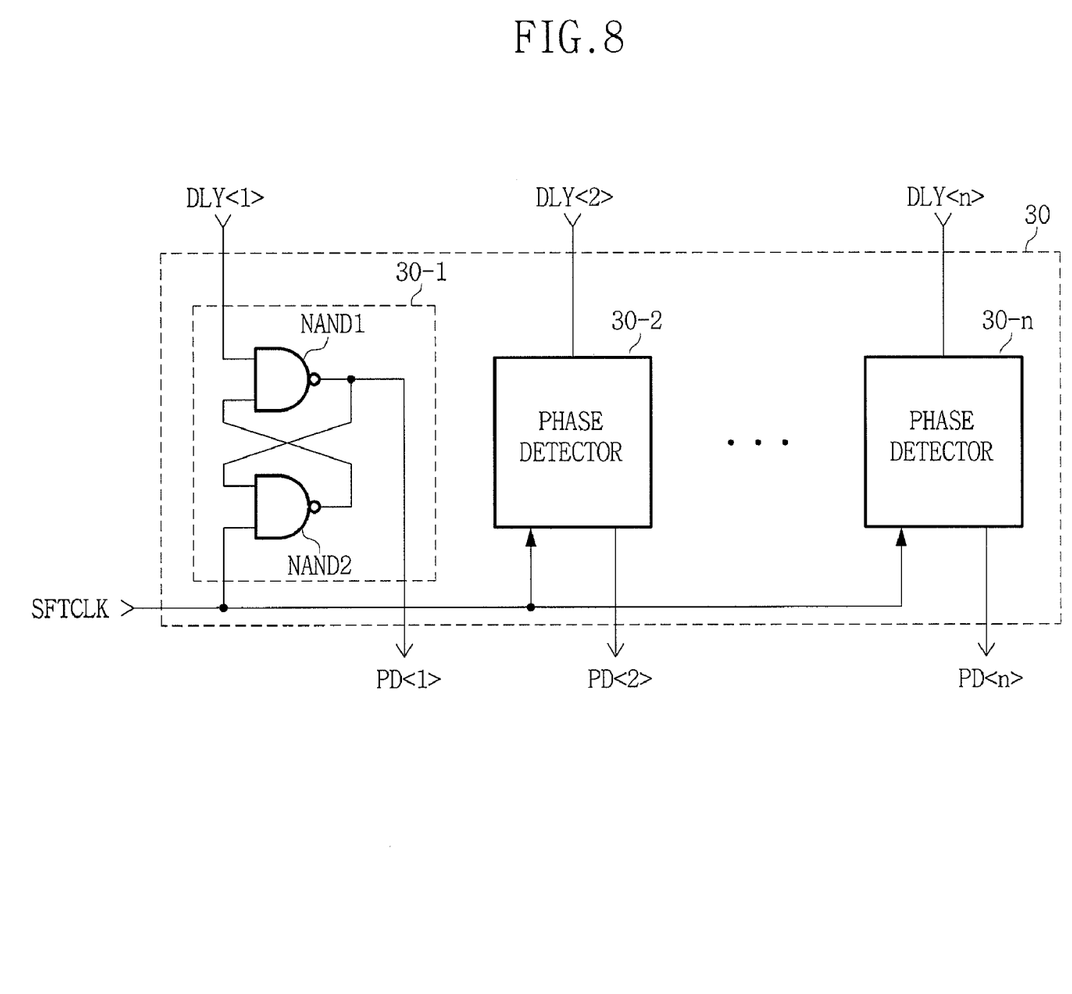
FIG. 8 is a circuit diagram illustrating a phase detecting unit of the frequency measuring circuit shown in FIG. 1.

FIG. 8 is a circuit diagram illustrating a phase detecting unit 30 of the frequency measuring circuit shown in FIG. 1. The phase detecting unit 30 may include a plurality of phase detectors 30-1 to 30-n, and each of the plurality of phase detectors 30-1 to 30-n may include two NAND gates NAND1 and NAND2.

Hereinafter, each of the blocks shown in FIG. 8 will be described.

Each of the plurality of phase detectors 30-1 to 30-n receives a corresponding delayed clock signal of the plurality of delayed clock signals DLY<1:n> and the shifted clock signal SFTCLK, detects a phase difference between the corresponding delayed clock signal and the shifted clock signal SFTCLK, and outputs a corresponding phase detecting signal of the plurality of phase detecting signals PD<1:n>.

Each of the plurality of phase detectors 30-1 to 30-n may include a NAND gate NAND1 and a NAND gate NAND2. The NAND gate NAND2 receives the shifted clock signal SFTCLK and a corresponding phase detecting signal of the plurality of phase detecting signals PD<1:n>, and performs a logical NAND operation. The NAND gate NAND1 receives the corresponding delayed clock signal of the plurality of delayed clock signals DLY<1:n> and an output signal of the NAND gate NAND2, and outputs the corresponding phase detecting signal of the plurality of phase detecting signals PD<1:n>. Therefore, when the corresponding delayed clock signal of the plurality of delayed clock signals DLY<1:n> becomes a logic high level first, a phase detecting signal output from each of the plurality of phase detectors 30-1 to 30-n becomes a logic low level. However, when the shifted clock signal SFTCLK becomes a logic high level first, an output of the NAND gate NAND2 becomes a logic low level. Therefore, the phase detecting signal maintains a logic high level even when the corresponding delayed clock signal of the plurality of delayed clock signals DLY<1:n> has logic high level.

Figure 9:
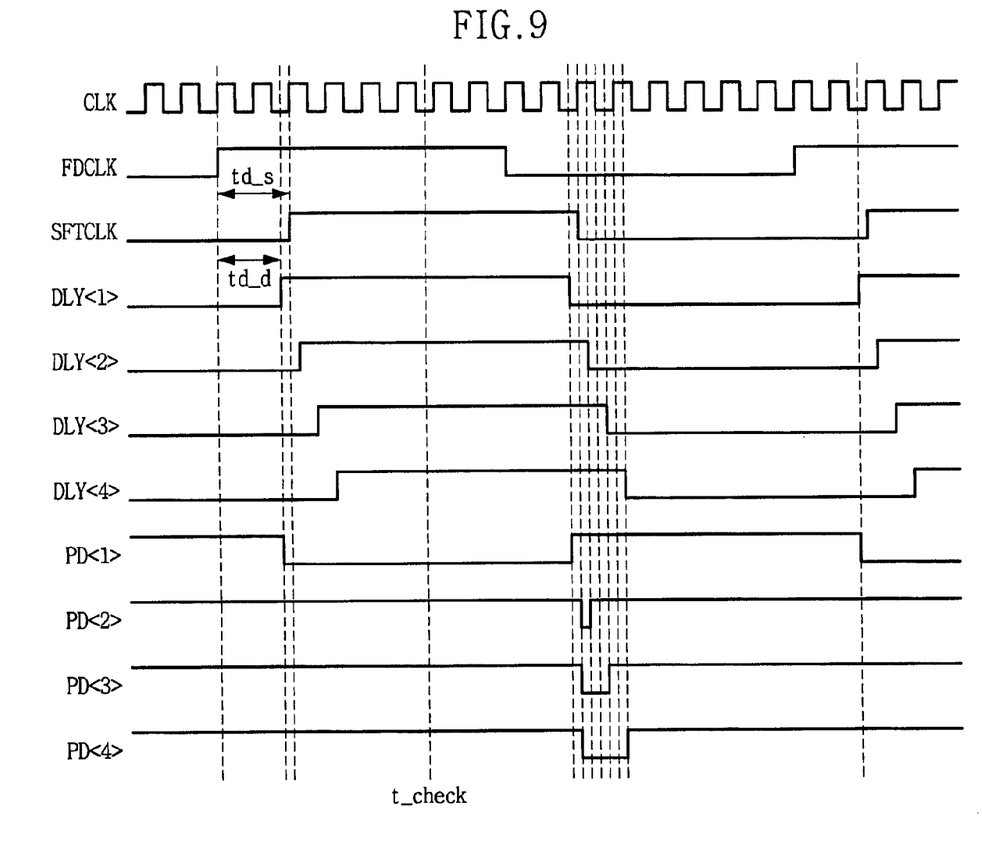
FIG. 9 is a timing diagram for a clock signal having high frequency and FIG. 10 is a timing diagram for a clock signal having low frequency.
Figure 10:
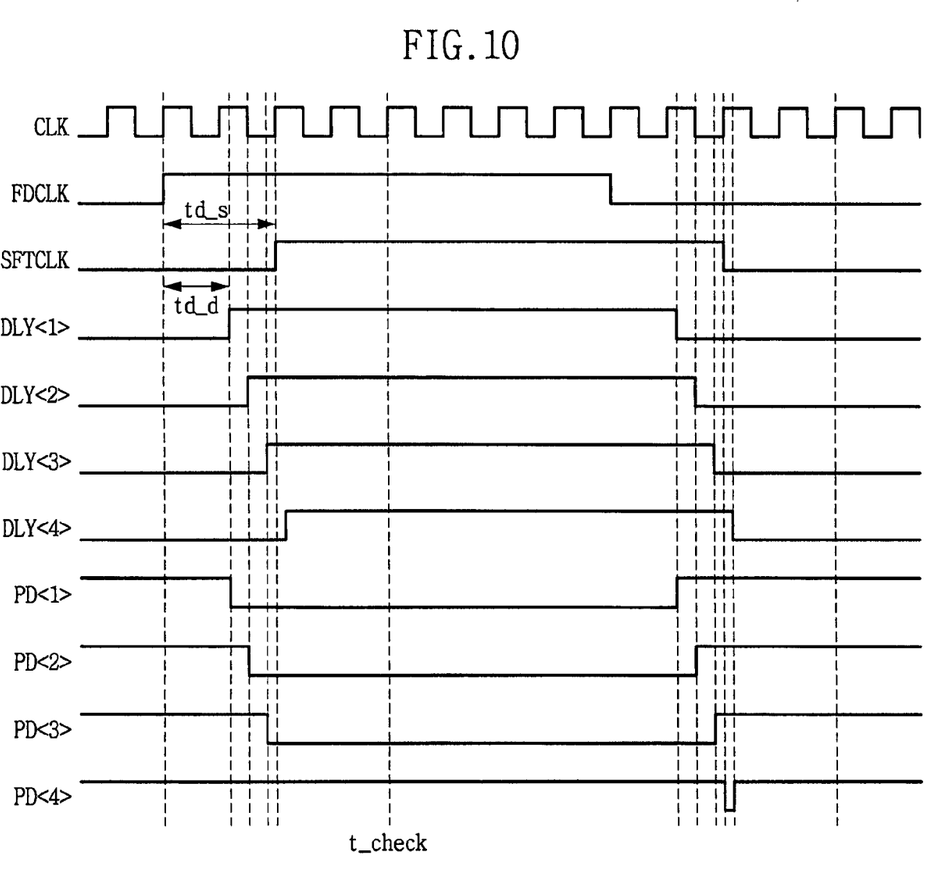

FIG. 9 and FIG. 10 are timing diagrams illustrating the operation of the frequency measuring circuit according to exemplary embodiments. In FIG. 9 and FIG. 10, the frequency dividing unit 11 includes four frequency dividers, the delayed clock signal generator 20 outputs four delayed clock signals, and the phase detecting unit 30 includes four phase detectors. Further, FIG. 9 is a timing diagram for a clock signal having high frequency and FIG. 10 is a timing diagram for a clock signal having low frequency. Further, in FIG. 9 and FIG. 10, CLK denotes the clock signal input from the exterior, FDCLK denotes the frequency-divided clock signal output from the frequency dividing unit 11, SFTCLK denotes the shifted clock signal output from the shifted clock signal generator 16, DLY<1> to DLY<4> denote the delayed clock signals output from the delayed clock signal generator 20, and PD<1> to PD<4> denote the phase detecting signals output from the phase detecting unit 30.

First, the frequency measuring circuit according to exemplary embodiments when the clock signal CLK has high frequency will be described referring to FIG. 9.

The operation of the frequency dividing unit 11 that outputs the frequency-divided clock signal FDCLK may be readily understood with reference to the description of FIG. 2 and FIG. 4.

Further, the operation of the shifted clock signal generator 16 that delays the frequency-divided clock signal FDCLK to output the shifted clock signal SFTCLK may be readily understood with reference to the description of FIG. 6 and FIG. 7. Further, the delayed clock signal generator 20 delays the frequency-divided clock signal FDCLK by a predetermined time to output the plurality of delayed clock signals DLY<1> to DLY<4>.

As illustrated in FIG. 9, the delay time difference td_s between the frequency-divided clock signal FDCLK and the shifted clock signal SFTCLK is proportional to the period of the clock signal CLK. On the other hand, the delay time difference td_d between the frequency-divided clock signal FDCLK and the delayed clock signal DLY<1> is determined without reference to the period of the clock signal CLK. Each of the delayed clock signals DLY<1> to DLY<4> is a delayed signal of the delayed clock signals DLY<1> by a predetermined time. That is, the delay time difference of each of the delayed clock signals DLY<1> to DLY<4> is determined without reference to the period of the clock signal CLK.

The phase detecting unit 30 receives the delayed clock signals DLY<1> to DLY<4> and the shifted clock signal SFTCLK, and detects phase difference between each of the delayed clock signals DLY<1> to DLY<4> and the shifted clock signal SFTCLK to output the phase detecting signals PD<1> to PD<4>. The operation of each of the phase detectors 30-1 to 30-4 may be readily understood with reference to the description of FIG. 8.

The phase detector 30-1 receives the delayed clock signal DLY<1> and the shifted clock signal SFTCLK, and outputs the phase detecting signal PD<1>. As illustrated in FIG. 9, the delayed clock signal DLY<1> becomes a logic high level first, and therefore the phase detector 30-1 outputs the phase detecting signal PD<1> that has a logic low level at a time t_check.

Each of the phase detectors 30-2 to 30-4 receives a corresponding delayed clock signal of the delayed clock signals DLY<2> to DLY<4> and the shifted clock signal SFTCLK to output a corresponding phase detecting signal of the phase detecting signals PD<2> to PD<4>. As illustrated in FIG. 9, when the frequency of the clock signal CLK is high, each of the phase detectors 30-2 to 30-4 outputs the phase detecting signals PD<2> to PD<4> having high levels at the time t_check because the shifted clock signal SFTCLK becomes a logic high level earlier than the delayed clock signals DLY<2> to DLY<4>.

When the levels of the phase detecting signals PD<2> to PD<4> are detected at the time t_check, the information on the frequency of the clock signal CLK may be known. That is, when the frequency of the clock signal CLK is high, the delay time difference td_s between the frequency-divided clock signal FDCLK and the shifted clock signal SFTCLK is relatively small. Therefore, a minority of the phase detecting signals among the phase detecting signals PD<1> to PD<4> become a logic low level.

Next, the frequency measuring circuit according to exemplary embodiments when the clock signal CLK has low frequency will be described referring to FIG. 10.

The frequency dividing unit 11 divides the frequency of the clock signal CLK input from the exterior to output the frequency-divided clock signal FDCLK.

The shifted clock signal generator 16 delays the frequency-divided clock signal FDCLK by the time proportional to the period of the clock signal CLK to output the shifted clock signal SFTCLK. That is, as shown in FIG. 10, the delay time difference td_s between the frequency-divided clock signal FDCLK and the shifted clock signal SFTCLK is proportional to the period of the clock signal CLK.

The delayed clock signal generator 20 outputs the plurality of delayed clock signals DLY<1> to DLY<4> having different delay time differences from each other without reference to the period of the frequency-divided clock signal FDCLK or the period of the clock signal CLK. That is, as illustrated in FIG. 10, the delay time difference td_d between the frequency-divided clock signal FDCLK and the delayed clock signal DLY<1> has a constant value without reference to the period of the clock signal CLK, and the delay time difference of each of the delayed clock signals DLY<1> to DLY<4> has a constant value without reference to the period of the clock signal CLK.

The phase detecting unit 30 receives the delayed clock signals DLY<1> to DLY<4> and the shifted clock signal SFTCLK, and detects phase difference between each of the delayed clock signals DLY<1> to DLY<4> and the shifted clock signal SFTCLK to output the phase detecting signals PD<1> to PD<4>.

Each of the phase detectors 30-1 to 30-3 receives a corresponding delayed clock signal of the delayed clock signals DLY<1> to DLY<3> and the shifted clock signal SFTCLK to output a corresponding phase detecting signal of the phase detecting signals PD<1> to PD<3>. As illustrated in FIG. 10, when the frequency of the clock signal CLK is low, the shifted clock signal SFTCLK is delayed more than when the frequency of the clock signal CLK is high. Therefore, the delayed clock signals DLY<1> to DLY<3> become a logic high level earlier than the shifted clock signal SFTCLK. Therefore, each of the phase detectors 30-1 to 30-3 outputs the phase detecting signals PD<1> to PD<3> having low level at time point t_check.

The phase detector 30-4 of the phase detecting unit 30 receives the delayed clock signal DLY<4> and the shifted clock signal SFTCLK, and senses the phase difference to output the phase detecting signal PD<4>. As illustrated in FIG. 10, the shifted clock signal SFTCLK becomes a logic high level earlier than the delayed clock signal DLY<4>, and therefore the phase detector 30-4 outputs the phase detecting signals PD<4> having logic high levels at a time t_check.

That is, when the frequency of the clock signal CLK is low, the delay time difference td_s between the frequency-divided clock signal FDCLK and the shifted clock signal SFTCLK is relatively large. Therefore, a majority of the phase detecting signals among the phase detecting signals PD<1> to PD<4> become a logic low level.

Figure 11:
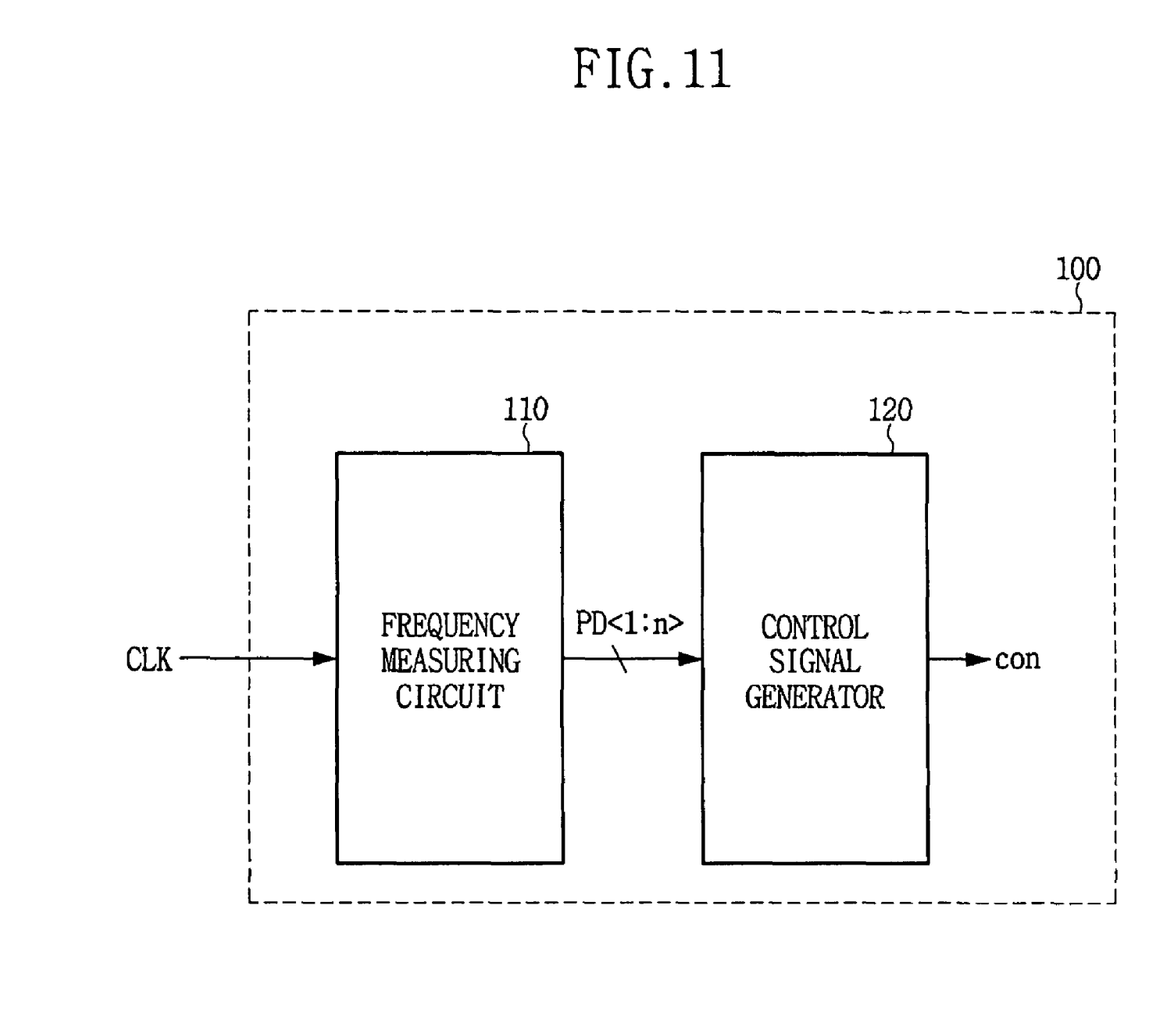
FIG. 11 is a block diagram illustrating a semiconductor device including the frequency measuring circuit according to exemplary embodiments.

FIG. 11 is a block diagram illustrating a semiconductor device 100 including the frequency measuring circuit according to exemplary embodiments. The semiconductor device 100 includes a frequency measuring circuit 110 and a control signal generator 120.

Hereinafter, each of the blocks shown in FIG. 11 will be described.

The frequency measuring circuit 110 may have the same structure as the circuit shown in FIG. 1, and receives a clock signal CLK input from an exterior to output phase detecting signals PD<1:n> that represent information related to a frequency of the clock signal CLK. The control signal generator 120 outputs a control signal con in response to the phase detecting signals PD<1:n>. The control signal con may be used for various purposes in the semiconductor device 100.

That is, the semiconductor device 100 according to exemplary embodiments includes the frequency measuring circuit 110 and the control signal generator 120, and may operate differently according to the frequency of the clock signal CLK. For example, as described above, the semiconductor device 100 may change a current (or a voltage) supplied to an input/output driver, or may change a delay time of a delay circuit of a delay-locked-loop used to generate an internal clock signal that is synchronized with a clock signal CLK supplied from the exterior. In the case of a semiconductor memory device, a circuit may be designed so that latency may be controlled in response to the control signal con.

Accordingly, the frequency measuring circuit according to exemplary embodiments senses the frequency of a clock signal by sensing a phase difference between a plurality of delayed clock signals having a constant delay time difference without reference to the period of the clock signal and a shift clock signal having a delay time difference that is proportional to the period of the clock signal. That is, the frequency measuring circuit according to exemplary embodiments has low power consumption because the frequency measuring circuit may simply measure a frequency of a clock signal input from the exterior using delay devices and latches. Further, the frequency measuring circuit according to exemplary embodiments may adjust the number of delay clock signals output from the delayed clock signal generator 20 and a delay time difference between the delay clock signals to adjust precision of the frequency measuring circuit. Therefore, it is possible to implement the frequency measuring circuit with high precision. Further, the frequency measuring circuit according to exemplary embodiments has a fast response time because the frequency of a clock signal may be detected in a predetermined clock period after the frequency measuring circuit starts to operate.

Accordingly, the frequency measuring circuit according to exemplary embodiments can have small power consumption, high precision and fast response time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A frequency measuring circuit, comprising:
    a divided and shifted clock signal generator configured to divide a frequency of a clock signal input from an exterior to output a frequency-divided clock signal, and configured to delay the frequency-divided clock signal by a time proportional to a period of the clock signal to output a shifted clock signal;
    a delayed clock signal generator configured to delay the frequency-divided clock signal by a fixed time to generate a plurality of delayed clock signals; and
    a phase detecting unit configured to receive the plurality of delayed clock signals and the shifted clock signal, and detect a phase difference between each of the plurality of delayed clock signals and the shifted clock signal to output a plurality of phase detecting signals that represent information for a frequency of the clock signal.

2. The frequency measuring circuit according to claim 1, wherein the divided and shifted clock signal generator includes:
    a frequency dividing unit configured to divide the frequency of the clock signal to output the frequency-divided clock signal; and
    a shifted clock signal generator configured to receive the frequency-divided clock signal and delay the frequency-divided clock signal by the time proportional to the period of the clock signal to output the shifted clock signal in response to the clock signal.

3. The frequency measuring circuit according to claim 2, wherein the delayed clock signal generator includes:
    a first delay circuit configured to have one or more delay devices serially connected and delay the frequency-divided clock signal by a first time to output a first delayed clock signal of the plurality of delayed clock signals; and
    a second delay circuit configured to have one or more delay devices serially connected to each other, delay the first delayed clock signal, and output delayed clock signals other than the first delayed clock signal.

4. The frequency measuring circuit according to claim 2, wherein the frequency dividing unit includes one or more frequency dividers, each of the frequency dividers including:
    a first frequency-dividing transmission gate configured to transmit an inverted signal of an output signal in response to a first level of an input signal;
    a first frequency-dividing latch circuit configured to latch and invert a signal transmitted through the first frequency-dividing transmission gate;
    a second frequency-dividing transmission gate configured to transmit an output signal of the first frequency-dividing latch circuit in response to a second level of the input signal; and
    a second frequency-dividing latch circuit configured to latch and invert a signal transmitted through the second frequency-dividing transmission gate to output the output signal, wherein the shifted clock signal generator includes:
    at least one first shift latch unit configured to latch, invert and output an input signal in response to a first level of the clock signal; and
    at least one second shift latch unit configured to latch, invert and output the input signal in response to a second level of the clock signal, wherein the first shift latch unit and the second shift latch unit are arranged one after the other and connected serially.

5. The frequency measuring circuit according to claim 1, wherein the phase detecting unit includes a plurality of phase detectors configured to receive a corresponding delayed clock signal of the plurality of delayed clock signals and the shifted clock signal, detect a phase difference between the corresponding delayed clock signal and the shifted clock signal, and output a corresponding phase detecting signal of the plurality of phase detecting signals, each of the phase detectors including:
    a first NAND gate configured to receive the shifted clock signal and the corresponding phase detecting signal, and perform a logical NAND operation; and
    a second NAND gate configured to receive the corresponding delayed clock signal and an output signal of the first NAND gate, and perform a logical NAND operation to output the corresponding phase detecting signal.

6. A semiconductor device, comprising:
    a frequency measuring circuit configured to receive a clock signal input from an exterior to output a plurality of phase detecting signals that represent information related to a frequency of the clock signal; and
    a control signal generator configured to output a control signal in response to the plurality of phase detecting signals, wherein the frequency measuring circuit comprises:
    a divided and shifted clock signal generator configured to divide the frequency of the clock signal to output a frequency-divided clock signal, and configured to delay the frequency-divided clock signal by a time proportional to a period of the clock signal to output a shifted clock signal;
    a delayed clock signal generator configured to delay the frequency-divided clock signal by a fixed time to generate a plurality of delayed clock signals; and
    a phase detecting unit configured to receive the plurality of delayed clock signals and the shifted clock signal, and detect a phase difference between each of the plurality of delayed clock signals and the shifted clock signal to output the plurality of phase detecting signals.

7. The semiconductor device according to claim 6, wherein the divided and shifted clock signal generator includes:
    a frequency dividing unit configured to divide the frequency of the clock signal to output the frequency-divided clock signal; and
    a shifted clock signal generator configured to receive the frequency-divided clock signal and delay the frequency-divided clock signal by the time proportional to the period of the clock signal to output the shifted clock signal in response to the clock signal.

8. The semiconductor device according to claim 7, wherein the delayed clock signal generator includes:
    a first delay circuit configured to have one or more delay devices serially connected and delay the frequency-divided clock signal by a first time to output a first delayed clock signal of the plurality of delayed clock signals; and a second delay circuit configured to have one or more delay devices serially connected, delay the first delayed clock signal, and output delayed clock signals except the first delayed clock signal.

9. The semiconductor device according to claim 7, wherein the frequency dividing unit includes one or more frequency dividers, each of the frequency dividers including:

- a first frequency-dividing transmission gate configured to transmit an inverted signal of an output signal in response to a first level of an input signal;
- a first frequency-dividing latch circuit configured to latch a signal transmitted through the first frequency-dividing transmission gate;
- a second frequency-dividing transmission gate configured to transmit an output signal of the first frequency-dividing latch circuit in response to a second level of the input signal; and
- a second frequency-dividing latch circuit configured to latch and invert a signal transmitted through the second frequency-dividing transmission gate to output the output signal, wherein the shifted clock signal generator includes:
  - at least one first shift latch unit configured to latch, invert and output a input signal in response to a first level of the clock signal; and
  - at least one second shift latch unit configured to latch, invert and output the input signal in response to a second level of the clock signal, wherein the first shift latch units and the second shift latch units are arranged one after the other and connected serially.

10. The semiconductor device according to claim 6, wherein the phase detecting unit includes a plurality of phase detectors configured to receive a corresponding delayed clock signal of the plurality of delayed clock signals and the shifted clock signal, detect a phase difference between the corresponding delayed clock signal and the shifted clock signal, and output a corresponding phase detecting signal of the plurality of phase detecting signals, each of the phase detectors including:

- a first NAND gate configured to receive the shifted clock signal and the corresponding delayed clock signal, and perform a logical NAND operation; and
- a second NAND gate configured to receive the corresponding delayed clock signal and an output signal of the first NAND gate, and perform a logical NAND operation to output the corresponding phase detecting signal.

* * * * *